United States Patent
Avanzino et al.

(10) Patent No.: US 6,422,918 B1
(45) Date of Patent: Jul. 23, 2002

(54) CHEMICAL-MECHANICAL POLISHING OF PHOTORESIST LAYER

(75) Inventors: Steven Avanzino, Cupertino; Bhanwar Singh, Morgan Hill; Bharath Rangarajan, Santa Clara; Alvin M. Dangca, Milpitas, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/478,118

(22) Filed: Jan. 4, 2000

(51) Int. Cl.$^7$ ................................................ B24B 49/00

(52) U.S. Cl. ................................. 451/8; 451/6; 451/41; 451/283

(58) Field of Search .................... 451/6, 8, 41, 283, 451/287

(56) References Cited

U.S. PATENT DOCUMENTS

| | | | |
|---|---|---|---|
| 4,576,612 A | * 3/1986 | Shukla et al. | |
| 5,702,290 A | 12/1997 | Leach | ........................ 451/41 |
| 6,261,151 B1 | * 7/2001 | Sandhu et al. | |
| 6,261,152 B1 | * 7/2001 | Aiyer | |
| 6,264,532 B1 | * 7/2001 | Meloni | |
| 6,277,236 B1 | * 8/2001 | Carlson | |

* cited by examiner

Primary Examiner—Timothy V. Eley
Assistant Examiner—Willie Berry, Jr.
(74) Attorney, Agent, or Firm—Amin & Turocy, LLP

(57) ABSTRACT

The present invention relates to a system for controllably removing photoresist. A CMP system is employed for polishing the photoresist. A non-abrasive polishing liquid adapted to react with the photoresist to sufficiently modify bonding in the photoresist is employed to facilitate surface layer removal of the photoresist by applied mechanical stress from the CMP system.

22 Claims, 3 Drawing Sheets

US 6,422,918 B1

CHEMICAL-MECHANICAL POLISHING OF PHOTORESIST LAYER

TECHNICAL FIELD

The present invention generally relates to a method for chemical mechanical polishing (CMP) of a photoresist layer

BACKGROUND OF THE INVENTION

In the semiconductor industry, there is a continuing trend toward higher device densities. To achieve these high densities, there has been and continues to be efforts toward scaling down device dimensions (e.g., at submicron levels) on semiconductor wafers. In order to accomplish such high device packing density, smaller and smaller feature sizes are required. This may include the width and spacing of interconnecting lines, spacing and size of memory cells, and surface geometry of various features such as corners and edges.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the photoresist, and an exposing source (such as optical light, x-rays, or an electron beam) illuminates selected areas of the surface through an intervening master template, the mask, for a particular pattern. The photoresist receives a projected image of the subject pattern. Once the image is projected, it is indelibly formed in the photoresist. The projected image may be either a negative or a positive image of the subject pattern. Exposure of the photoresist through a photomask causes the image area to become either more or less soluble (depending on the coating) in a particular solvent developer. The more soluble areas are removed in the developing process to leave the pattern image in the photoresist as less soluble polymer.

The goal of the photoresist application process is to achieve a thin, uniform layer of photoresist on a wafer surface. Layers of photoresist materials are routinely applied to wafers multiple times during a manufacturing process for integrated circuits, as one of a sequence of steps to produce a desired lithographic pattern. The photoresist material is spin-coated onto to the wafer at a typical thickness ranging from 0.5 $\mu$m to 2 $\mu$m with better than 1% (1$\sigma$) non-uniformity. The photoresist generally may be described as a class of novolac/styrenic compounds, and are formulated currently to be used with either i-line (365 nm) or deep-ultraviolet (DUV, 248 nm or 193 nm) sources of illuminating energy.

Projection lithography is a powerful and essential tool for microelectronics processing. As feature sizes are driven smaller and smaller, optical systems are approaching limits caused by the wavelengths of the optical radiation. A recognized way of reducing feature size of circuit elements is to lithographically image the features with radiation of a shorter wavelength. "Long" or "soft" x-rays (extreme ultraviolet (EUV), deep ultraviolet (DUV)), wavelength range of 5–200 nm are now at the forefront of research in an effort to achieve smaller feature sizes.

Although EUV lithography provides substantial advantages with respect to achieving high resolution patterning, the shorter wavelength radiation is highly absorbed by the photoresist material. Consequently, the penetration depth of the radiation into the photoresist is limited. The limited penetration depth of the shorter wavelength radiation requires use of ultra-thin photoresists so that the radiation can penetrate the entire depth of the photoresist in order to effect patterning thereof.

Photolithographic performance can be significantly enhanced via thinner photoresist layers. Thus, it would be desirable to controllably make thinner the photoresist layer at some point in the lithographic process after initial application of the photoresist to the wafer.

SUMMARY OF THE INVENTION

The present invention provides for a system and methodology for controllably reducing thickness of a photoresist layer. In particular, a planarization process is employed utilizing chemical mechanical polishing (CMP) techniques and a polishing liquid that allows for controlled removal of desired amounts of the photoresist layer. The present invention employs a polishing liquid which reacts with the photoresist (resin) at the surface/subsurface range. The degree of reaction is not great enough to cause rapid or measurable dissolution (e.g., chemical etching) of the photoresist, but reacts sufficiently to modify chemical bonding in the photoresist to facilitate surface layer removal by applied mechanical stress (e.g., via use of a CMP polishing pad).

The present invention through proper balance of mechanical abrasion and chemical reaction provides for controlled removal of photoresist to result in a substantially thin photoresist layer of desired, uniform thickness with a well-polished surface that is microscopically smooth and substantially free of surface defects and/or residues.

One aspect of the present invention relates to a system for controllably removing photoresist. A CMP system polishes the photoresist. A non-abrasive polishing liquid reacts with the photoresist to sufficiently modify bonding in the photoresist to facilitate surface layer removal of the photoresist by applied mechanical stress from the CMP system.

Another aspect of the present invention relates to a system for polishing a photoresist layer. A polishing pad is employed to polish the photoresist layer. A CMP drive system selectively applies the polishing pad against the photoresist layer at a predetermined downward force and rate of rotation. A measuring system is employed to facilitate measuring a thickness of the photoresist layer. A processor employs information from the measuring system to control the CMP drive system. A non-abrasive polishing liquid is used to react with the photoresist to sufficiently modify bonding in the photoresist to facilitate surface layer removal of the photoresist by applied mechanical stress from the CMP system.

Yet another aspect of the invention relates to a system for controllably removing photoresist, including: means for polishing the photoresist; and means for reacting with the photoresist to sufficiently modify bonding in the photoresist to facilitate surface layer removal of the photoresist by the means for polishing the photoresist.

Still yet another aspect of the subject invention relates to a method for controllably removing photoresist, including the steps of: using a CMP system to polish the photoresist; and using a non-abrasive polishing liquid adapted to react with the photoresist to sufficiently modify bonding in the photoresist to facilitate surface layer removal of the photoresist by applied mechanical stress from the CMP system.

Another aspect of the present invention relates to a polishing liquid for reacting with a photoresist to sufficiently modify bonding in the photoresist to facilitate surface layer removal of the photoresist by applied mechanical stress, including: at least one of KOH and $(CH_3)_4NOH$.

Still yet another aspect of the present invention relates to a method for polishing a photoresist layer. In the method, a polishing pad is used to polish the photoresist layer. A CMP drive system is used to selectively apply the polishing pad against the photoresist layer at a predetermined downward force and rate of rotation. A measuring system is employed to facilitate measuring a thickness of the photoresist layer. A processor utilizes information from the measuring system to control the CMP drive system. The method further includes the step of using a non-abrasive polishing liquid adapted to react with the photoresist to sufficiently modify bonding in the photoresist to facilitate surface layer removal of the photoresist by applied mechanical stress from the CMP system.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
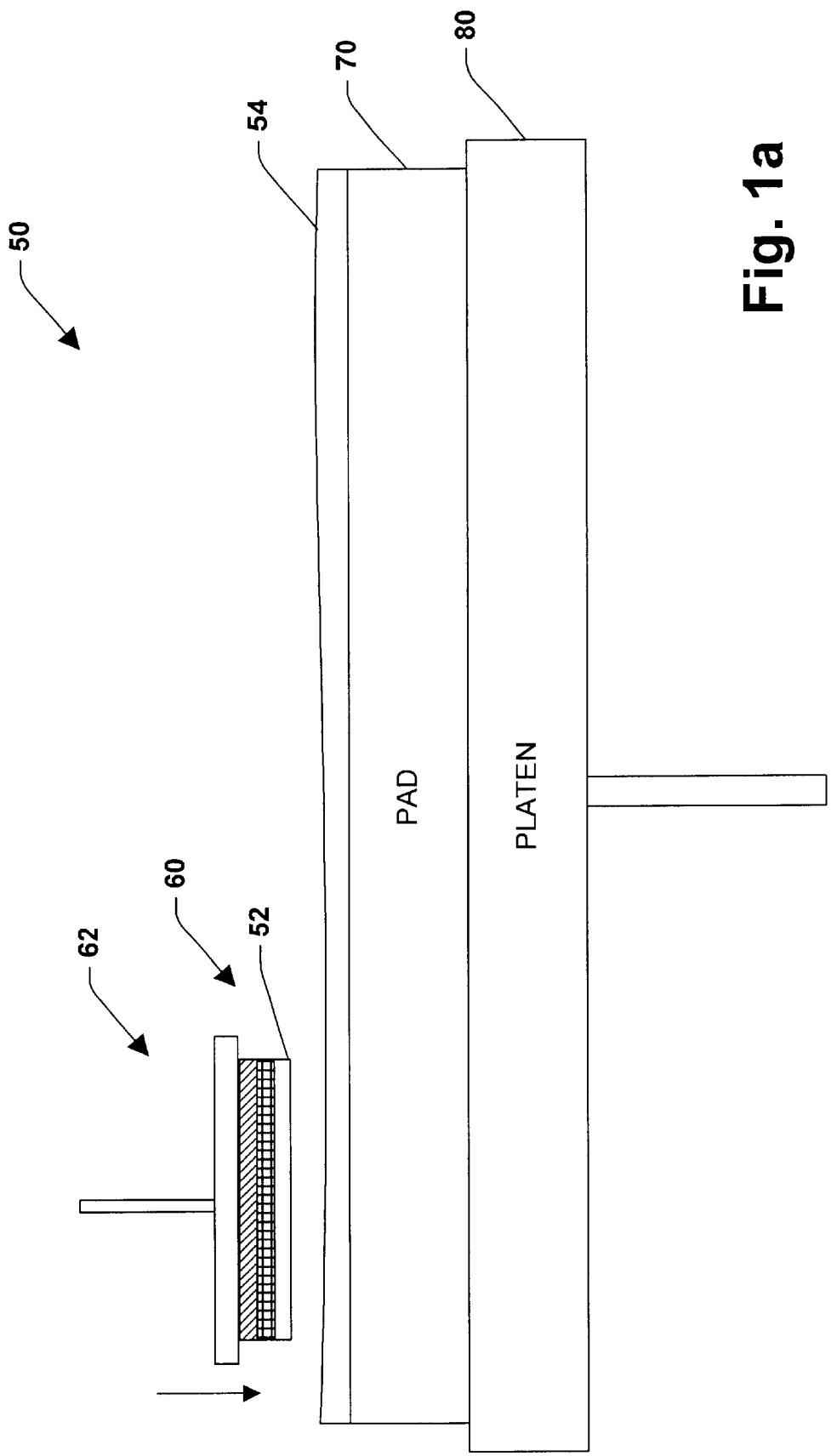
FIG. 1a is a representative schematic illustration of a CMP system in accordance with the present invention.

The present invention will now be described with reference to the drawings, wherein like reference numerals are used to refer to like elements throughout.

FIG. 1a is a representative schematic illustration of a system 50 for controllably removing desired amounts of photoresist 52 to achieve a uniform photoresist layer of a desired thickness. The system 50 employs CMP techniques and a polishing liquid 54 that allows for controlled removal of desired amounts of the photoresist 52. Through proper balance of mechanical abrasion and chemical reaction the system 50 provides for controlled removal of the photoresist 52 to result in the substantially thin photoresist layer of desired, uniform thickness with a well-polished surface that is microscopically smooth and substantially free of surface defects and/or residues. A wafer 60 is fixed in a rotating carrier 62, and a polishing pad 70 is moved by a rotating platen 80 (or belt) across the wafer 60. The rotation speed of the wafer 60 and/or polishing pad 70 and/or applied pressure of the polishing pad 70 and/or pH of the polishing liquid 54 may be selectively adjusted to achieve a desired rate of photoresist removal.

The polishing liquid 54 reacts with the photoresist (resin) 52 at the surface/subsurface range. The degree of reaction is not great enough to cause rapid or measurable dissolution (e.g., chemical etching) of the photoresist 52, but reacts sufficiently to modify chemical bonding in the photoresist 52 to facilitate surface layer removal by applied mechanical stress (e.g., via use of the CMP polishing pad 70).

Preferred polishing parameters fall within about the range of:

| | |
|---|---|
| Downforce | 1–4 psi |
| Wafer backside pressure | 0–1.4 psi |
| Table rotation | 20–50 rpm |
| Carrier rotation | 10–15 rpm |
| Solution flow | 250–500 ml/min. |
| Solution pH | 10–12.1 |
| Polish time | 30–360 sec. |

Experimental results indicate that a downforce of about 2 psi is preferred. A detailed discussion relating to the process of photoresist removal, specific aspects of the polishing liquid 54 and specific aspects of the polishing pad 70 are discussed below in connection with FIGS. 2–4.

Figure 1B:
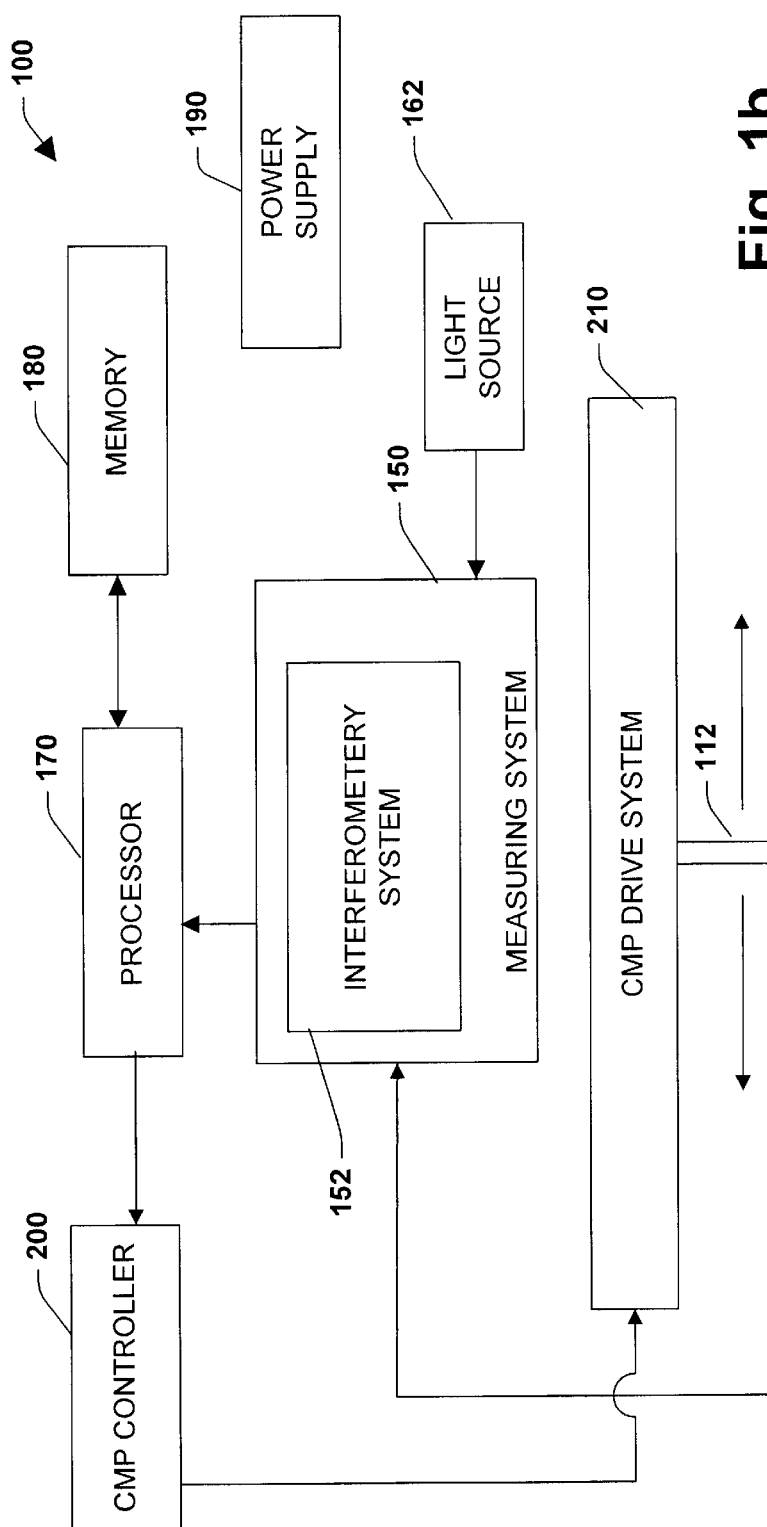
FIG. 1b is a representative schematic illustration of another CMP system in accordance with the present invention.

FIG. 1b is a representative schematic illustration of another CMP system 100 for carrying out the present invention. The system 100 includes a polishing pad 110 and a respective spindle 112. Associated with the polishing pad 110 is an optical wave guide (e.g., optical fiber) 120. The spindle 112 is adapted to be moveable horizontally as well as vertically so as to selectively position the pad 110 for polishing. It is to be appreciated that multiple spindles and pads may be employed to carry out the present invention. The speed of the spindle 112 and/or applied pressure of the polishing pad 110 and/or pH of the polishing liquid 104 may be selectively adjusted to achieve a desired rate of photoresist removal.

The optical wave guide 120 projects radiation onto respective portions of the surface of a wafer 130 (which includes an intermediate layer 132 and a substrate 134). Radiation reflected from the wafer substrate surface is processed by a measuring system 150 to measure the thickness of the photoresist 102 being polished. The reflected radiation is processed with respect to the incident radiation in measuring the photoresist layer 102 thickness.

The measuring system 150 includes an interferometry system 152. It is to be appreciated that any suitable interferometry system may be employed to carry out the present invention and such systems are intended to fall within the scope of the hereto appended claims. Interferometry systems are well known in the art, and therefore further discussion related thereto is omitted for sake of brevity.

A source 162 of monochromatic radiation such as a laser provides radiation to the optical wave guide 120 via the measuring system 150. Preferably, the radiation source 162 is a frequency stabilized laser however it will be appreciated that any laser or other radiation source (e.g., laser diode or helium neon (HeNe) gas laser) suitable for carrying out the present invention may be employed.

A processor 170 receives the measured data from the measuring system 150 and determines the thickness of the photoresist material 102 being polished. The processor 170 is operatively coupled to the measuring system 150 and is programmed to control and operate the various components within the system 100 in order to carry out the various functions described herein. The processor or CPU 170 may be any of a plurality of processors, suitable for carrying out the present invention. The manner in which the processor 170 can be programmed to carry out the functions relating to the present invention will be readily apparent to those having ordinary skill in the art based on the description provided herein.

A memory 180 which is operatively coupled to the processor 170 is also included in the system 100 and serves to store program code executed by the processor 170 for carrying out operating functions of the system 100 as described herein. The memory 180 also serves as a storage medium for temporarily storing information such as photoresist layer thickness, spindle rotation rate, polishing pad position, polishing liquid information, interferometry information, and other data which may be employed in carrying out the present invention.

Power supply 190 provides operating power to the system 100. Any suitable power supply (e.g., battery, line power) may be employed to carry out the present invention.

The processor 170 is also coupled to a CMP control system 200 which controls a CMP drive system 210 which drives the spindles and also applies the polishing pad 110 at a desired pressure against the wafer surface. The processor 170 is able to monitor the thickness of the photoresist layer 102 and selectively regulate the spindle drive rate, application pressure of the polishing pad 110, pH of the polishing liquid, temperature of the polishing liquid, amount of polishing liquid, and other parameters relevant to carrying out the present invention. As a result, the system 100 provides for achieving a photoresist layer of substantially uniform thickness with a well-polished surface that is microscopically smooth and substantially free of surface defects and/or residues, which in turn improves fidelity of integrated circuit fabrication.

Figure 2:
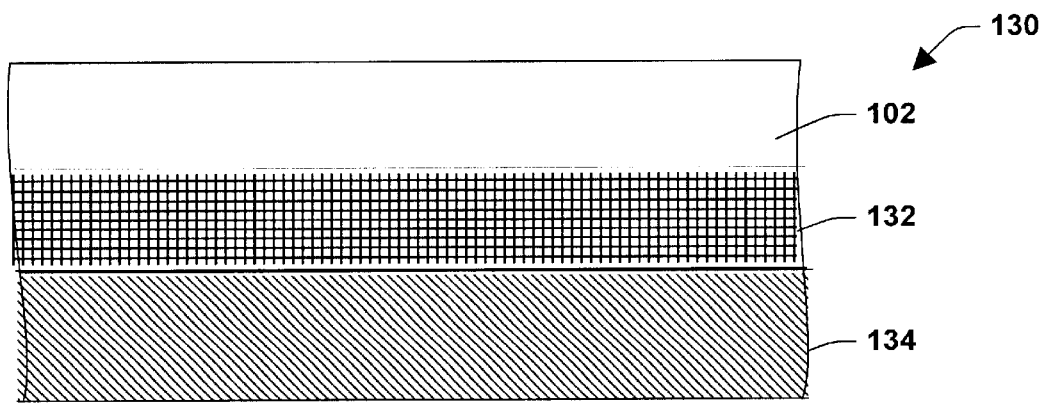
FIG. 2 is a schematic cross-sectional illustration of a structure including a substrate, an intermediate layer and a photoresist layer.
Figure 3:
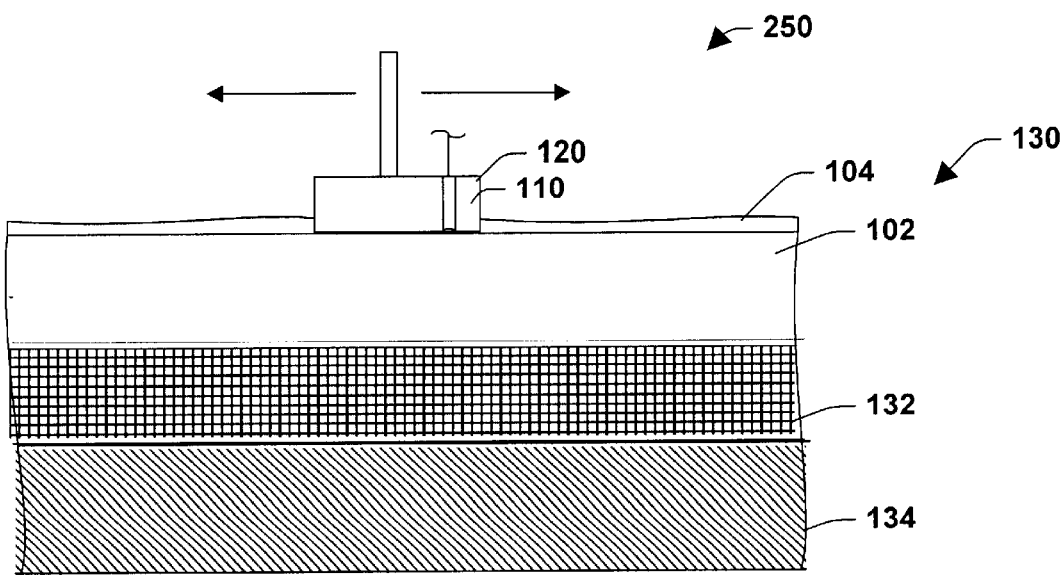
FIG. 3 is a schematic cross-sectional illustration of the structure of FIG. 2 undergoing a CMP process in accordance with the present invention.
Figure 4:
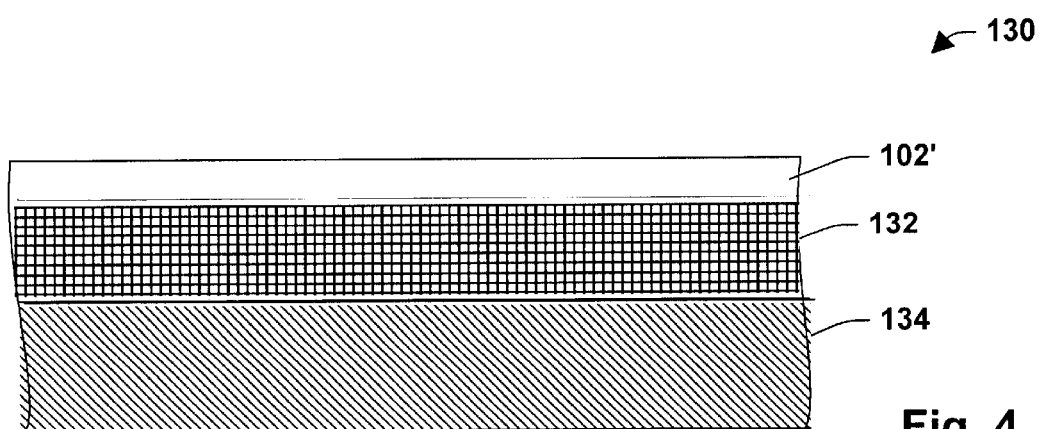
FIG. 4 is a schematic cross-sectional illustration of the structure of FIG. 3 after the CMP process is substantially complete.

FIGS. 2–4 schematically illustrate a CMP process to controllably remove desired amounts of photoresist in accordance with the present invention. FIG. 2 schematically illustrates the wafer 130 including the photoresist layer 102 over the intermediate layer 132 (e.g., metal layer, dielectric layer, semiconductor layer), which lies over the substrate 134. It is to be appreciated that although the following discussion of the CMP process is discussed with reference to the system 100, the process may be employed in connection with the CMP system 50 of FIG. 1a as well as any CMP system suitable for carrying out the present invention.

The scope of the present invention as defined by the hereto appended claims is intended to include any suitable photoresist material suitable for being planarized in accordance with the present invention. Some examples of photoresist materials that the present invention may be applied to include: a 157 nm sensitive photoresist, a 193 nm sensitive photoresist, an I-line, H-line, G-line, E-line, mid UV, deep UV, extreme UV, x-ray resist, electron-beam resist or chemically amplified photoresist material. Positive or negative photoresists may be used, but positive photoresists are preferred. Photoresists are commercially available from a number of sources, including Shipley Company, DuPont, Arch Chemical Inc., Aquamer, Hunt, Hoechst Celanese Corporation, Clariant, JSR Microelectronics, and Brewer. The resist 102 is typically applied to a thickness ranging from about 200 Å to about 10,000 Å, however, the resist 102 may be applied at any suitable thickness for carrying out the present invention.

FIG. 3 schematically illustrates the structure 130 undergoing a chemical mechanical polishing (CMP) step 250 to remove desired amount of the photoresist layer 102. The CMP process 250 preferably removes about 100 Å–500 Å in some applications, thousands of Å photoresist may be removed. The range specified here is appropriate for T-tops or silicon grass applications of the photoresist layer 102. It is to be appreciated that the CMP process 250 described herein may be suitable tailored to remove a desired thickness of the photoresist layer 102, ranging from 50 Å to 10,000 Å.

The CMP process 250 of the present invention provides for controlled removal of desired amounts of the photoresist layer 102 that results in a remaining photoresist layer 102 (FIG. 4) of accurate thickness and low non-uniformity. To accomplish the CMP process 250, the polishing liquid 104 is applied to the structure 130 with the capability to react with the photoresist 102 at the surface/subsurface range. The degree of reaction should not be great enough to cause rapid or measurable dissolution of the photoresist 102, but should modify chemical bonding in the resist surface layer to facilitate surface layer removal by applied mechanical stress. Although numerous chemicals that attack photoresist may be considered, the present invention makes use of the fact that solutions of a base (preferably a strong base such as KOH or $(CH_3)_4NOH$) will react with the photoresist, the rate and extent of reaction depending on the base concentration. Bases are materials that when placed in water have a pH higher than 7. Bases include hydroxide compounds, silicate compounds, carbonate and bicarbonate compounds. By way of example, hydroxide compounds include alkali metal hydroxides such as sodium hydroxide and potassium hydroxide, alkaline earth metal hydroxides such as calcium hydroxide and magnesium hydroxide, ammonium hydroxides such as ammonium hydroxide and quaternary alkyl ammonium hydroxides, phosphonium hydroxides, and sulfonium hydroxides such as sulfonium hydroxide and tertiary alkyl sulfonium hydroxide. Similarly, silicate compounds, carbonate and bicarbonate compounds include alkali metal, alkaline earth metal, ammonium, phosphonium and sulfonium silicates, carbonates and bicarbonates.

A second parameter for successful photoresist CMP is the application of mechanical stress. Photoresist resins are soft materials that easily undergo plastic deformation. Care must be taken in choosing a polishing surface. The polishing pad 110 should be a soft, compressible material of uniform density. Preferably, the polishing pad material is highly porous, both for compressibility and so as to deliver liquid medium to and photoresist by-products away from the structure surface. The polishing pad should exhibit high surface area contact with the structure 130 so that load stresses are uniformly distributed over the polished surface. One example of a preferred polishing pad is a foamed, urethane pad manufactured by Rodel, Inc. designated as Politex Supreme, embossed. It is to be appreciated that any polishing pad suitable for carrying out the present invention may be employed and is intended to fall within the scope of the hereto appended claims.

The use of abrasive particles in the form of a slurry (a typical feature of conventional CMP) is unnecessary when polishing a soft, readily soluble substance such as the photoresist 102. Accordingly, the preferred liquid polishing medium 104 employed in accordance with the present invention comprises an aqueous solution with substantially no abrasive content, and a non-ionic polyethylene oxide type surfactant, Triton X100, at a 200 ppm concentration level, to reduce friction between the pad 120 and wafer 130, thus preventing excess shear stress from being applied to the photoresist layer 102. Mechanical stresses are applied directly to the photoresist layer 102 by the polymeric surface of the polishing pad 110.

After the CMP process 250 is substantially complete, the surface of the structure 130 is cleaned using suitable techniques.

FIG. 4 illustrates the structure 130 after the CMP process 250 is complete. The CMP process 250 removed portions of the photoresist layer 102 to result in a substantially thin photoresist layer of desired, uniform thickness with a well-polished surface that is microscopically smooth and substantially free of surface defects and/or residues.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for controllably removing photoresist, comprising:
   a CMP system for polishing the photoresist; and
   a non-abrasive polishing liquid that reacts with the photoresist to sufficiently modify bonding in the photoresist to facilitate surface layer removal of the photoresist by applied mechanical stress from the CMP system.

2. The system of claim 1, the polishing liquid being tailored to avoid rapid and/or measurable dissolution of the photoresist.

3. The system of claim 1, the polishing liquid including at least one of KOH and $(CH_3)_4NOH$.

4. The system of claim 1 further including a polishing pad with a polymeric surface.

5. The system of claim 4, the polishing pad being rotated at a predetermined speed to facilitate removal of a desired amount of the photoresist.

6. The system of claim 1 employing polishing parameters falling within the range of:

| | |
|---|---|
| Downforce | 1–4 psi |
| Wafer backside pressure | 0–1.4 psi |
| Table rotation | 20–50 rpm |
| Carrier rotation | 10–15 rpm |
| Solution flow | 250–500 ml/min. |
| Solution pH | 10–12.1 |
| Polish time | 30–360 sec. |

7. The system of claim 1, the polishing solution including a non-ionic polyethylene oxide type surfactant.

8. A system for polishing a photoresist layer, comprising:
   a polishing pad for polishing the photoresist layer;
   a CMP drive system for selectively applying the polishing pad against the photoresist layer at a predetermined downward force and rate of rotation;
   a measuring system to facilitate measuring a thickness of the photoresist layer;
   a processor for employing information from the measuring system to facilitate controlling the CMP drive system; and
   a non-abrasive polishing liquid that reacts with the photoresist to sufficiently modify bonding in the photoresist to facilitate surface layer removal of the photoresist by applied mechanical stress from the CMP system.

9. The system of claim 8 further including an optical waveguide for directing radiation on the surface of the photoresist layer.

10. The system of claim 9, employing interferometry techniques to determining photoresist layer thickness.

11. The system of claim 8, the polishing liquid being tailored to avoid rapid and/or measurable dissolution of the photoresist.

12. The system of claim 8, the polishing liquid including at least one of KOH and $(CH_3)_4NOH$.

13. The system of claim 8 further including a polishing pad with a polymeric surface.

14. The system of claim 13, the polishing pad being rotated at a predetermined speed to facilitate removal of a desired amount of the photoresist.

15. The system of claim 8, the polishing solution including a non-ionic polyethylene oxide type surfactant.

16. A system for controllably removing photoresist, comprising:
   means for polishing the photoresist; and
   means for chemically reacting with the photoresist to sufficiently modify bonding in the photoresist to facilitate surface layer removal of the photoresist by the means for polishing the photoresist.

17. A method for controllably removing photoresist, comprising the steps of:
   using a CMP system to polish the photoresist; and
   using a non-abrasive polishing liquid that reacts with the photoresist to sufficiently modify bonding in the photoresist to facilitate surface layer removal of the photoresist by applied mechanical stress from the CMP system.

18. The method of claim 17, the polishing liquid, comprising: at least one of KOH and $(CH_3)_4NOH$.

19. The method of claim 18 the polishing liquid having a pH within the range of 9 to 13.

20. The method of claim 18 the polishing liquid having a pH within the range of 10 to 12.1.

21. The method of claim 18 the polishing liquid further comprising a non-ionic polyethylene oxide type surfactant.

22. A method for polishing a photoresist layer, comprising the steps of:
   using a polishing pad for polishing the photoresist layer;
   using a CMP drive system to selectively applying the polishing pad against the photoresist layer at a predetermined downward force and rate of rotation;
   using a measuring system to facilitate measuring a thickness of the photoresist layer;
   using a processor for employing information from the measuring system to control the CMP drive system; and
   using a non-abrasive polishing liquid that reacts with the photoresist to sufficiently modify bonding in the photoresist to facilitate surface layer removal of the photoresist by applied mechanical stress from the CMP system.

\* \* \* \* \*